United States Patent [19]

Margalit et al.

[11] Patent Number: 5,359,495
[45] Date of Patent: Oct. 25, 1994

[54] PRINTED CIRCUIT BOARD HAVING A CUTOUT

[75] Inventors: Yanki Margalit, Givataim; Danny Margalit, Tel Aviv, both of Israel

[73] Assignee: Aladdin Knowledge Systems Ltd., Tel-Aviv, Israel

[21] Appl. No.: 27,316

[22] Filed: Jan. 21, 1993

[51] Int. Cl.⁵ .............................................. H05K 7/02
[52] U.S. Cl. .................................. 361/760; 439/65; 174/260
[58] Field of Search ..................... 439/49–50, 439/53, 59–62, 65; 361/760, 761, 807, 808, 809; 174/55, 250, 260

[56] References Cited

U.S. PATENT DOCUMENTS 5,121,297  6/1992  Haas ..................................... 174/255

Primary Examiner—Leo P. Picard
Assistant Examiner—Bot Ledynh
Attorney, Agent, or Firm—Benjamin J. Barish

[57] ABSTRACT

A printed circuit board includes electrical circuit components electrically connected to a plurality of male connectors mounted on the board and extending outwardly of one edge for connecting the board into an electrical system. The printed circuit board is formed with a cutout adjacent a second edge to define a first board section bordering one side of the cutout and including the first edge mounting the male electrical connectors outwardly thereof, and a second board section bordering another side of the cutout and including the second edge facing outwardly of the board and another edge facing inwardly of the board. The inwardly-facing edge of the second board section includes a plurality of female connectors connected to the circuit components to permit mounting an electrical device to extend inwardly of the second board section into the cutout.

17 Claims, 2 Drawing Sheets

PRINTED CIRCUIT BOARD HAVING A CUTOUT

FIELD AND BACKGROUND OF THE INVENTION

The present invention relates to the construction of printed circuit boards, and particularly to printed circuit boards which include a group of connectors extending outwardly of one edge of the board for connecting the board into an electrical system. The invention is particularly useful in printed circuit boards connected into a data processor for controlling the operation of the data processor and/or for controlling another device electrically connected to the data processor.

An example of a system in which the invention is particularly useful is a personal computer which can be programmed to perform a particular operation, such as a word processing operation. Personal computers commonly include a printed circuit board having a first plurality of connectors mounted on the board and extending outwardly of one edge thereof for connecting the board into the personal computer and a second plurality of connectors mounted on the board and extending outwardly of a second edge of the board for connecting the board to a security device which prevents the operation of the computer to perform a programmed operation (e.g., a word processing operation) unless the security device is mounted to the printed circuit board. Thus, unless the user has such a security device mounted to the printed circuit board, the user cannot perform the operation of that particular program.

In the conventional personal computer, the printed circuit board is constructed so as to receive the security device on the outwardly-facing edge of the printed circuit board. Since the security device, located externally of the printed circuit board, is thus easily accessible to anyone near the computer, it is a simple matter for someone to steal the security device by merely physically removing it from the printed circuit board. As such security devices represent substantial value, such thefts have become a serious problem.

OBJECTS AND BRIEF SUMMARY OF THE INVENTION

An object of the present invention is to provide a printed circuit board construction which increases the difficulty of removing an electrical device, such as the above-mentioned security device, by an unauthorized person.

According to the present invention, there is provided a printed circuit board including a rigid insulating base and electrical circuit components mounted thereon and electrically connected to a first plurality of connectors formed on the rigid insulating base and extending outwardly of one edge of the rigid insulating base for connecting the board into an electrical system. The rigid insulating base is formed with a cutout adjacent a second edge to define a first rigid insulating base section bordering one side of the cutout and including the first edge mounting the first plurality of electrical connectors outwardly thereof, and a second rigid insulating base section bordering another side of the cutout and including the second edge facing outwardly of the rigid insulating base and another edge facing inwardly of the rigid insulating base. The inwardly-facing edge of the second rigid insulating base section is formed with a second plurality of connectors connected to the circuit components to permit mounting an electrical device to extend inwardly of the second rigid insulting base section into the cutout.

It will thus be seen that printed circuit boards constructed in accordance with the foregoing features makes it extremely difficult, if possible at all, for an unauthorized person to remove an electrical device, such as a security device protecting a program, since the security device faces inwardly of the printed circuit board into the cutout and is therefore not conveniently accessible to an unauthorized person. Another advantage of the novel printed circuit board construction is that it enables an electrical device to be connected to the printed circuit board so as not to project externally of the printed circuit board, thereby providing a more pleasing, compact, appearance to the overall system.

According to further features in the described preferred embodiment, the cutout has a right-angle corner such that the first and second rigid insulating base sections are at right angles to each other. Preferably, the cutout is of rectangular configuration and extends from the second rigid insulating base section to the opposite edge of the rigid insulating base.

According to further features in the described preferred embodiment, the first plurality of connectors are male connectors, and the second plurality of connectors are female connectors. In the described preferred embodiment, the second plurality of connectors are included in a connector device carried by the second rigid insulating base section at its inwardly-facing edge.

As indicated earlier, the invention is particularly useful in printed circuit boards applied to a digital processor wherein the electrical device is a security device preventing a particular operation of the digital processor unless the security device is mounted in the connector device carried by the inwardly-facing edge of the second rigid insulating base section.

According to further features in a described preferred embodiment, the electrical device may include connectors on one side electrically connected to the connectors on the inwardly-facing edge of the second rigid insulating base section, and additional connectors on the opposite side of the electrical device for mounting at least one additional electrial device to extend inwardly of the second rigid insulating base section further into the cutout.

According to a still further described embodiment, the printed circuit board may also include a third plurality of electrical connectors carried on the outer edge of the second rigid insulating base section for receiving another electrical device to extend outwardly of the second rigid insulating base section.

The invention thus provides a still further advantage in that the printed circuit board can be adapted to accommodate more than one electrical device to be connected to the electrical system via the printed circuit board.

Further features and advantages of the invention will be apparent from the description below.

BRIEF DESCRIPTION OF THE DRAWINGS

The invention is herein described, by way of example only, with reference to the accompanying drawings, wherein.

DESCRIPTION OF PREFERRED EMBODIMENTS

Figure 1:
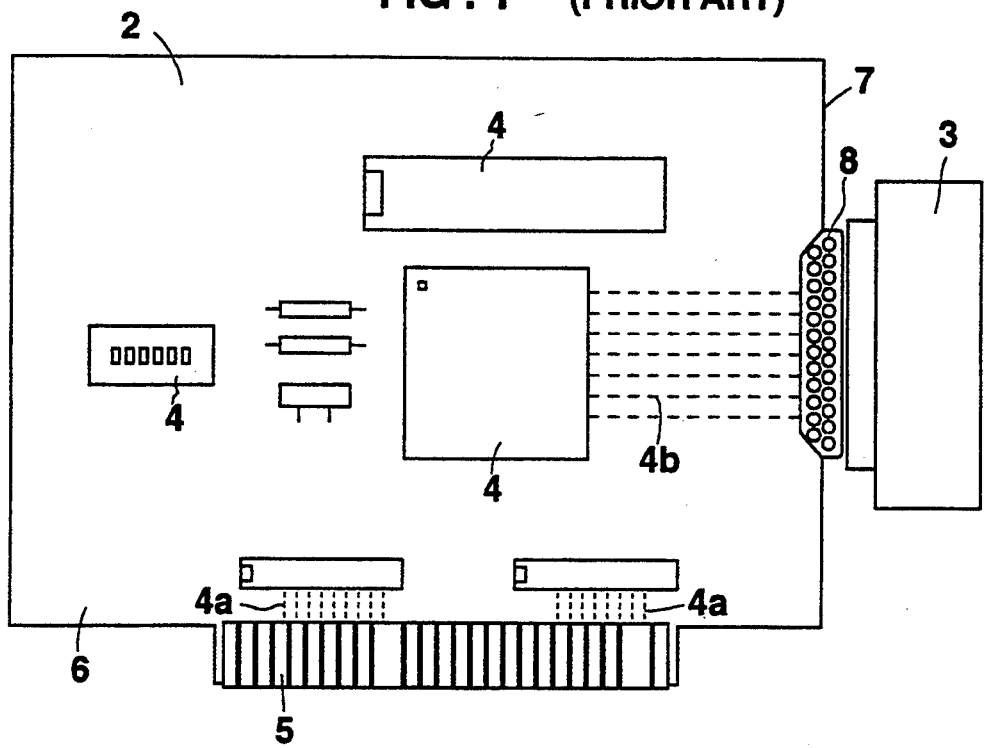
FIG. 1 illustrates a conventional, prior art, printed circuit board commonly used in personal computers for receiving a security device to provide protection against an unauthorized use of a computer program.

With reference first to FIG. 1, there is illustrated a conventional, prior art printed circuit board 2 such as may be used for receiving a security device 3 to be electrically connected to a computer in order to prevent a particular programmed operation (e.g., a word processing operation) unless the security device is attached to the printed circuit board. Such security devices are commonly provided with software programs for personal computers in order to assure that only a computer equipped with such a security device may be used for executing the program.

The conventional printed ciruit board illustrated in FIG. 1 includes a rigid insulating base 2 and a plurality of electrical circuit components, generally designated 4, mounted thereon and electrically connected to a plurality of connectors 5 extending outwardly of one edge 6 of the board for connecting the board into the personal computer. In the conventional construction, a second edge 7 carries a second plurality of electrical connectors, shown at 8, facing outwardly of the board for plugging-in the security device 3.

The circuit components 4, electrical connectors 5, and electrical connectors 8, are normally connected together into an electrical circuit by printed circuit conductive pathways, shown at 4a, 4b in FIG. 1. While the electrical connectors 5 for connecting the board into the personal computer are male-type connectors, the electrical connectors 8 are generally female connectors for receiving male connectors carried by the security device 3.

Since the security device 3 in FIG. 1 thus faces outwardly of the printed circuit board, it is easy for anyone in the vicinity to physically remove and steal the security device.

Figure 2:
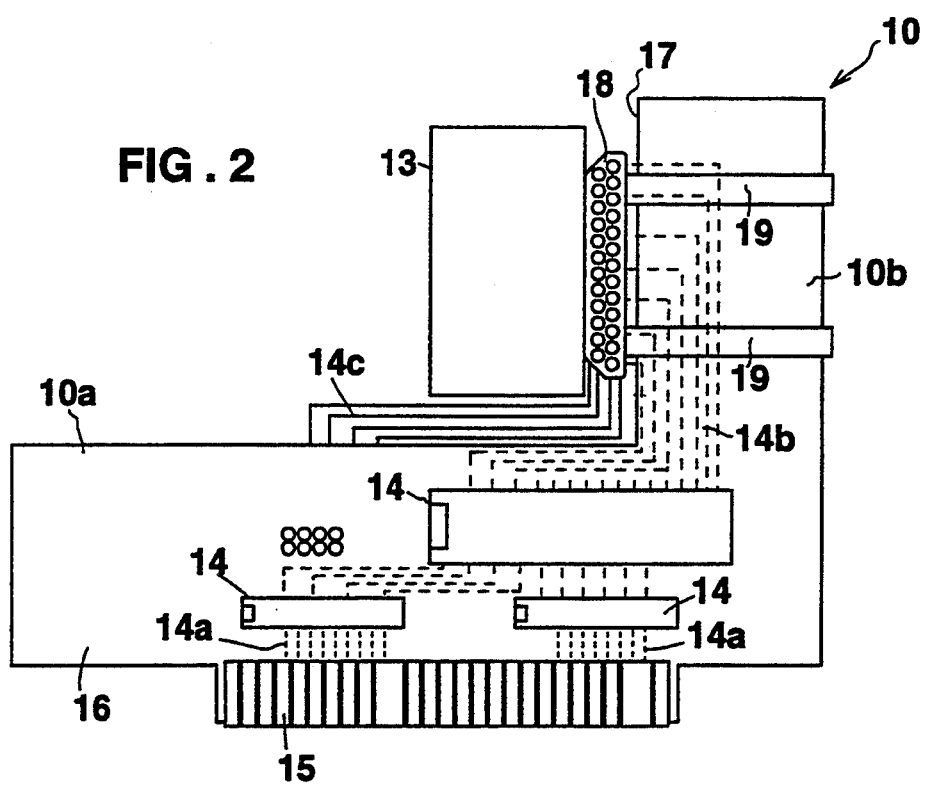
FIG. 2 illustrates a printed circuit board constructed in accordance with the present invention for receiving a security device in a manner to provide protection against theft of the security device.

FIG. 2 illustrates a printed circuit including a rigid insulating base, generally designated 10, constructed in accordance with the present invention to make it more difficult to steal a security device, therein designated 13, from the board. Thus, as shown in FIG. 2, the rigid insulating base 10 of the printed circuit board is formed with a cutout of rectangular configuration to define a first base section 10a for mounting the electrical circuit components 14, and a second base section 10b for mounting the security device 13.

Base section 10a carrying the electrical circuit components 14 is also formed, as in FIG. 1, with the plurality of electrical connectors, 15, extending outwardly of its edges 16 for connection into the electrical system of the personal computer. However, in the construction of FIG. 2, the security device 13 is mounted to the inwardly-facing edge 17 of the second base section 10b. The latter section thus carries the plurality of connectors 18 for receiving the security device, such that the security device 13 does not project outwardly of the printed circuit board as in FIG. 1, but rather extends inwardly into the cutout and thereby is not exposed for easy removal.

Since the cutout in the rigid insulating base 10 of the printed circuit board of FIG. 2 is of rectangular configuration, it will be seen that the two base sections 10a, 10b are at right-angles to each other. Connector device 18 for receiving the security device 13 may be mounted to base section 10b in any suitable manner, such as by a pair of bands 19 carried at the opposite ends of connector device 18 and enclosing board section 10b.

The electrical circuit components 14, connectors 15, and connectors 18, may be connected together by printed circuit conductive pathways 14a, 14b, as in the conventional board of FIG. 1; alternatively, some wire jumpers (shown at 14c) may be used, e.g., to minimize redesign of the printed circuit board. As in the conventional board of FIG. 1, connectors 15 connecting the board to the personal computer are male-type connectors, whereas connector device 18 may include female-type connectors adapted to receive male-type connectors carried by the security device 13.

The cutout formed in base 10 of FIG. 2 extends from base section 10b for the complete length of the base to its opposite edge. This provides a large space for accommodating more than one electrical device to extend inwardly of the base.

Figure 3:
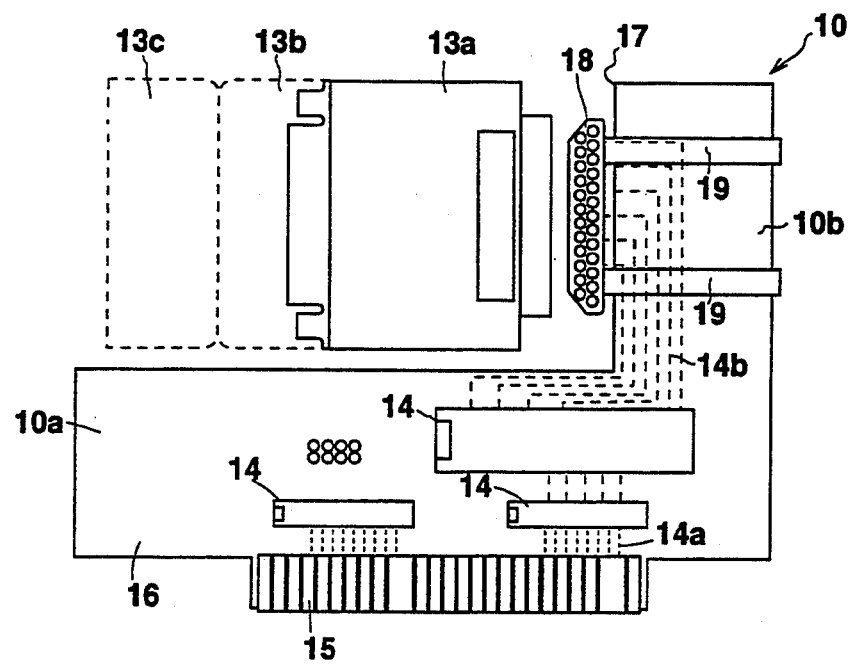
FIGS. 3 and 4 illustrate two further constructions of printed circuit boards in accordance with the present invention to enable the boards to receive not only a security device, but other electrical devices in a compact manner.

The latter arrangement is illustrated in FIG. 3. In FIG. 3, the printed circuit board is of the same construction as illustrated in FIG. 2, and is therefore identified by the same reference numerals, except that a plurality of electrical devices, shown at 13a, 13b, 13c, are connected together and mounted to base section 10b to extend inwardly of the board. For example, electrical device 13a could be a security device, corresponding to device 3 in FIG. 1, for providing protection against unauthorized use of a computer program, whereas the other electrical devices 13b, 13c, could be used for other purposes, such as for connecting output devices (e.g., printers, displays, etc. ) to the personal computer.

In the arrangement illustrated in FIG. 3, the connectors 18 carried on the inner edge of base section 10b would be of the female type for receiving male conenctors at the corresponding end (right side) of the first electrical device 13a, whereas the connectors on the opposite side (left side) of the electrical device 13a would include connectors of the opposite type (e.g., female) for receiving connectors of the male type on the respective end of the next electrical device 13b connected thereto, and so on with respect to electrical device 13c.

Figure 4:
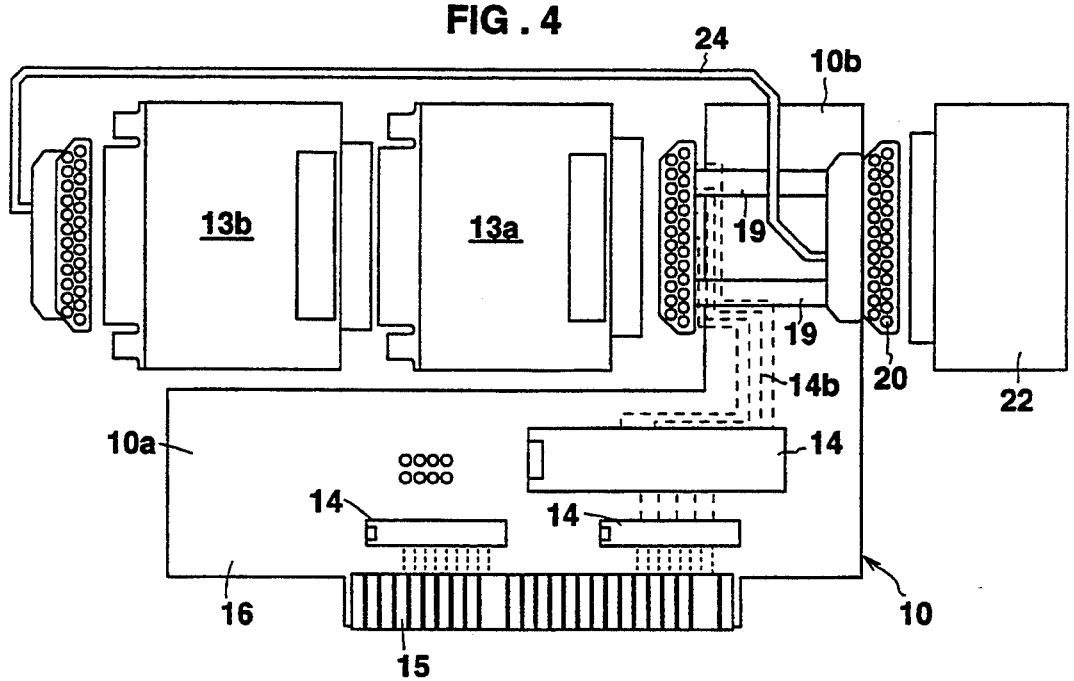

FIG. 4 illustrates a further construction, which is similar to that illustrated in FIG. 3, and therefore the corresponding parts have been similarly numbered to facilitate understanding. In the construction of FIG. 4, however, not only is the inner edge 17 of base section 10b provided with connectors 4 for receiving the electrical devices 13a–13c, but also the outer edge of the base section 10b is provided with further connectors, shown at 20, for receiving a further electrical device 22 to extend outwardly of the printed circuit board. In this case, the end (third) electrical device 13c mounted to the inner edge of base section 10b includes a flexible cable, shown at 24, connected to the connectors 20 at the outer edge of base section 10b, for electrically connecting electrical device 22 in the circuit. This construction thus increases the number of output (or input) devices, such as printers or displays, which may be connected via the printed circuit board to the personal computer.

While the invention has been described with respect to several preferred embodiments, it will be appreciated that these are set forth merely for purposes of example, and that many other variations, modifications and applications of the invention may be made.

What is claimed is:

1. A printed circuit board including a rigid insulating base and electrical circuit components mounted thereon and electrically connected to a first plurality of connectors formed on the rigid insulating base and extending outwardly of one edge of the rigid insulating base for connecting the board into an electrical system; characterized in that said rigid insulating base is formed with a cutout adjacent a second edge thereof to define a first rigid insulating base section bordering one side of said cutout and including said first edge mounting said first plurality of electrical connectors outwardly thereof, and a second rigid insulating base section bordering another side of said cutout and including said second edge facing outwardly of the rigid insulating base and another edge facing inwardly of the rigid insulating base; said inwardly-facing edge of the second rigid insulating base section being formed with a second plurality of connectors connected to said circuit components, to permit mounting an electrical device to extend inwardly of said second rigid insulating base section into said cutout.

2. The printed circuit board according to claim 1, wherein said cutout has a right-angle corner such that said first and second rigid insulating base sections are at right angles to each other.

3. The printed circuit board according to claim 2, wherein said cutout is of rectangular configuration and extends from said second rigid insulating base section to the opposite edge of the rigid insulating base.

4. The printed circuit board according to claim 1, wherein said first plurality of connectors are male connectors, and said second plurality of connectors are female connectors.

5. The printed circuit board according to claim 1, wherein said second plurality of connectors are included in a connector device carried by the second rigid insulating base section at said inwardly-facing edge thereof.

6. The printed circuit board according to claim 5, in combination with an electrical device mounted to said connector device to extend inwardly of said second rigid insulating base section into said cutout.

7. The printed circuit board according to claim 6, further in combination with said electrical system wherein said electrical system is a digital processor, and said electrical device is a security device preventing a particular operation of the digital processor unless the security device is mounted in said connector device carried at said inwardly-facing edge of the second rigid insulating base section.

8. The printed circuit board according to claim 6, wherein said electrical device mounted at said inwardly-facing edge of the second rigid insulating base section includes a first plurality of connectors on one side electrically connected to said second plurality of connectors at the inwardly-facing edge of the second rigid insulating base section when mounted thereto to extend inwardly of said second rigid insulating base section into said cutout, and a second plurality of connectors on the opposite side of the electrical device for mounting at least one additional electrical device to extend inwardly of the second rigid insulating base section further into said cutout.

9. The printed circuit board according to claim 1, further including a third plurality of electrical connectors carried on the outer edge of said second rigid insulating base section or receiving another electrical device to extend outwardly of said second rigid insulating base section.

10. A printed circuit board comprising:
a rigid insulating base;
electrical circuit components mounted thereon;
and a plurality of male connectors connected to said electrical circuit components and extending outwardly of one edge of the rigid insulating base for connecting the board into an electrical system;
said rigid insulating base being formed with a cutout adjacent a second edge thereof to define a first rigid insulating base section bordering one side of said cutout and including said first edge mounting said plurality of male electrical connectors outwardly thereof, and a second rigid insulating base section bordering another side of said cutout and including said second edge facing outwardly of the rigid insulating base and another edge facing inwardly of the rigid insulating base;
said inwardly-facing edge of the second rigid insulating base section including a plurality of female connectors connected to said circuit components, to permit mounting an electrical device to extend inwardly of said second rigid insulating base section into said cutout.

11. The printed circuit board according to claim 10, wherein said cutout has a right-angle corner such that said first and second rigid insulating base sections are at right angles to each other.

12. The printed circuit board according to claim 11, wherein said cutout is of rectangular configuration and extends from said second rigid insulating base section to the opposite edge of the rigid insulating base.

13. The printed circuit board according to claim 10, wherein said plurality of female connectors are included in a connector device carried by the second rigid insulating base section at said inwardly-facing edge thereof.

14. The printed circuit board according to claim 13, in combination with an electrical device mounted to said connector device to extend inwardly of said second rigid insulating base section into said cutout.

15. The printed circuit board according to claim 14, further in combination with said electrical system wherein said electrical system is a digital processor, and said electrical device is a security device preventing a particular operation of the digital processor unless the security device is mounted in said connector device carried at said inwardly-facing edge of the second rigid insulating base section.

16. The printed circuit board according to claim 15, wherein said electrical device mounted at said inwardly-facing edge of the second rigid insulating base section includes a first plurality of connectors on one side electrically connected to said second plurality of connectors at the inwardly-facing edge of the second rigid insulating base section when mounted thereto to extend inwardly of said second rigid insulating base section into said cutout, and a second plurality of connectors on the opposite side of the electrical device for mounting at least one additional electrical device to extend inwardly of the second rigid insulating base section further into said cutout.

17. The printed circuit board according to claim 10, further including a third plurality of electrical connectors carried on the outer edge of said second rigid insulating base section for receiving another electrical device to extend outwardly of said second rigid insulating base section.

* * * * *